United States Patent
Liu et al.

(10) Patent No.: US 11,423,991 B2
(45) Date of Patent: Aug. 23, 2022

(54) METHOD AND APPARATUS FOR DATA ERASE IN MEMORY DEVICES

(71) Applicant: Yangtze Memory Technologies Co., Ltd., Hubei (CN)

(72) Inventors: Lei Liu, Wuhan (CN); Wenxi Zhou, Wuhan (CN); Zhiliang Xia, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 17/113,582

(22) Filed: Dec. 7, 2020

(65) Prior Publication Data

US 2021/0375368 A1    Dec. 2, 2021

Related U.S. Application Data

(63) Continuation of application No. PCT/CN2020/093096, filed on May 29, 2020.

(51) Int. Cl.
*G11C 16/14* (2006.01)
*G11C 16/04* (2006.01)
(Continued)

(52) U.S. Cl.
CPC .......... *G11C 16/14* (2013.01); *G11C 16/0425* (2013.01); *G11C 16/26* (2013.01); *G11C 16/30* (2013.01)

(58) Field of Classification Search
CPC ..... G11C 16/0483; G11C 16/14; G11C 16/16; G11C 16/0425
(Continued)

(56) References Cited

U.S. PATENT DOCUMENTS 5,293,337 A    3/1994 Aritome et al.
9,805,805 B1    10/2017 Zhang et al.
(Continued)

FOREIGN PATENT DOCUMENTS

CN    110993009 A    4/2020
TW    201044393 A1    12/2010
(Continued)

OTHER PUBLICATIONS

Chinese Office Action dated May 18, 2022 in Chinese Application No. 202110508780.0.

*Primary Examiner* — Alfredo Bermudez Lozada
(74) *Attorney, Agent, or Firm* — Oblon, McClelland, Maier & Neustadt, L.L.P.

(57) ABSTRACT

Aspects of the disclosure provide a method for data erase in a memory device. The method includes providing first erase carriers from a body portion for the memory cell string, during an erase operation in a memory cell string. The first erase carriers flow in a first direction from a source side of the memory cell string to a drain side of the memory cell string. Further, the method includes providing second erase carriers from a junction at the drain side of the memory cell string. The second erase carriers flow in a second direction from the drain side of the memory cell string to the source side of the memory cell string. Then, the method includes injecting the first erase carriers and the second erase carriers to charge storage portions of the memory cells in the memory cell string.

20 Claims, 5 Drawing Sheets

(51) Int. Cl.
*G11C 16/26* (2006.01)
*G11C 16/30* (2006.01)

(58) Field of Classification Search
USPC .................................. 365/185.17, 185.29
See application file for complete search history.

(56) References Cited

U.S. PATENT DOCUMENTS

2014/0151783 A1   6/2014  Park et al.
2020/0143893 A1*  5/2020  Rabkin ................. G11C 16/32

FOREIGN PATENT DOCUMENTS

TW       201944541 A    11/2019
TW          I686807 B     3/2020

* cited by examiner

METHOD AND APPARATUS FOR DATA ERASE IN MEMORY DEVICES

RELATED APPLICATION

This application is a bypass continuation of International Application No. PCT/CN2020/093096, filed on May 29, 2020. The entire disclosure of the prior application is hereby incorporated by reference in its entirety.

BACKGROUND

Semiconductor memory devices can be categorized into volatile memory devices and non-volatile memory devices. The volatile memory devices lost data when power is off. The non-volatile memory devices can retain stored data even power is disconnected. To achieve higher data storage density, semiconductor manufactures developed vertical device technologies, such as three dimensional (3D) NAND flash memory technology, and the like. 3D NAND flash memory device is a kind of non-volatile memory devices.

SUMMARY

Aspects of the disclosure provide a method for data erase in a memory device. The method includes providing first erase carriers from a body portion for the memory cell string, during an erase operation for resetting memory cells connected in series in a memory cell string. The first erase carriers flow in a first direction between a source side of the memory cell string and a drain side of the memory cell string. Further, the method includes providing second erase carriers from a junction at the drain side of the memory cell string, during the erase operation. The second erase carriers flow in a second direction that is opposite of the first direction. Then, the method includes injecting, during the erase operation, the first erase carriers and the second erase carriers to charge storage portions of the memory cells in the memory cell string. The injected first erase carriers and the second erase carriers are stored in the charge storage portions of the memory cells.

In some embodiments, the first erase carriers and the second erase carriers are holes. To provide the first erase carriers, in some embodiments, the method includes floating a source terminal at the source side of the memory cell string, and applying a positive voltage to a P-type well corresponding to the body portion of the memory cell string. The positive voltage causes the first erase carriers to flow in the first direction.

To provide the second erase carriers, the method includes negatively biasing a gate terminal of a first select transistor in the memory cell string with regard to a drain terminal of the first select transistor. The negative biasing causes a generation of the second erase carriers at a P-N junction at the drain side of the memory cell string due to a band-to-band tunneling at the P-N junction. In some embodiments, the first select transistor is a closet select transistor to the drain side of the memory cell string, and the method further includes negatively biasing a gate terminal of a second select transistor in the memory cell string with regard to a drain terminal of the second select transistor that is disposed next to the first select transistor.

In some embodiments, the method includes applying an erase voltage to a drain terminal at the drain side of the memory cell string, applying a first voltage, that is lower than the erase voltage, on the gate terminal of the first select transistor, and applying a second voltage, that is lower than the first voltage, on the gate terminal of the second select transistor.

In some embodiments, the method includes negatively biasing a gate terminal of a first select transistor at the source side of the memory cell string with regard to a source/drain terminal of the first select transistor. The negative biasing causes a generation of additional erase carriers at a P-N junction at the source side of the memory cell string due to a band-to-band tunneling at the P-N junction.

In an embodiment, the first select transistor is a closet select transistor to the source side of the memory cell string. The method then includes negatively biasing a gate terminal of a second select transistor in the memory cell string with regard to a drain terminal of the second select transistor that is disposed next to the first select transistor. In an example, the method includes applying a first voltage that is lower than the positive voltage applied to the P-type well of the memory cell string, and applying a second voltage that is lower than the first voltage on the gate terminal of the second select transistor.

According to an aspect of the disclosure, the first erase carriers and the second erase carriers are provided in a same erase cycle.

Aspects of the disclosure can provide a semiconductor memory device. The semiconductor memory device includes a memory cell array including at least a memory cell string with memory cells connected in series in the memory cell string. The semiconductor memory device also includes peripheral circuitry including a control circuit. The control circuit is configured to cause the periphery circuitry to provide signals to the memory cell array in order to perform the above method for data erase in the memory cell array.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
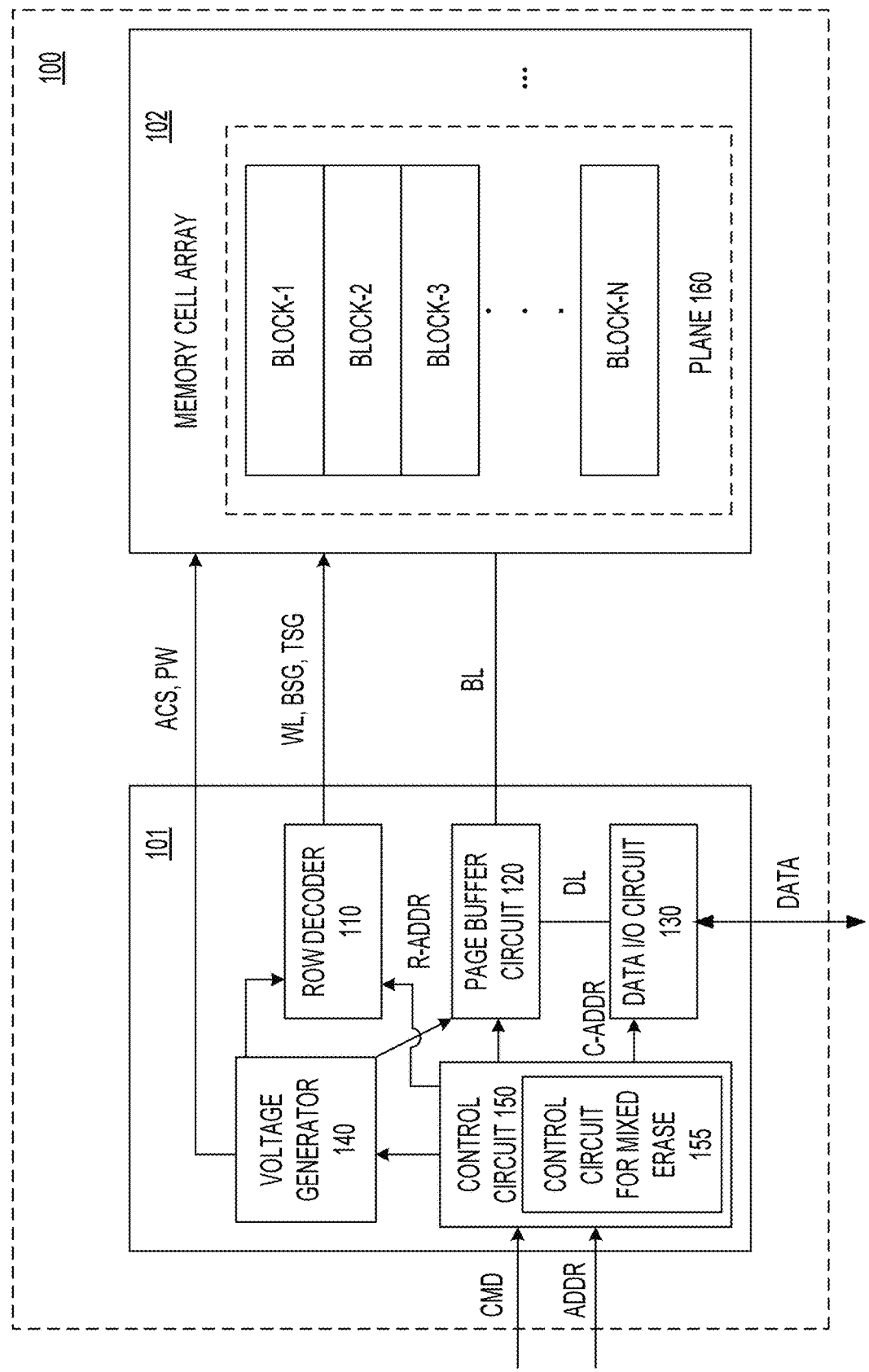
FIG. 1 shows a block diagram of a semiconductor memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide techniques of mixed erase mechanisms for data erase in non-volatile memory devices, such as NAND flash memory device. Generally, for NAND flash memory device, memory cells are arranged in memory cell strings. To achieve higher data storage, the memory cell strings can be relatively long. Each memory cell string includes memory cell transistors and select transistors connected in series. The two ends of the memory cell string can be referred to as a source side and a drain side of the memory cell string. The techniques of mixed erase mechanisms use both body erase mechanism and gate induced drain leakage (GIDL) erase mechanism during an erase operation, and the mixed erase mechanisms can provide erase carriers from both the source side and the drain side of the memory cell string. Thus, memory cells along a long memory cell string can be erased effectively.

FIG. 1 shows a block diagram of a semiconductor memory device 100 according to some embodiments of the disclosure. The semiconductor memory device 100 includes a memory array 102 and periphery circuitry 101 coupled together. In some examples, the memory array 102 and the periphery circuitry 101 are disposed on a same die (chip). In other examples, the memory array 102 is disposed on an array die, the periphery circuitry 101 is disposed on a different die, such as a die that is implemented using complementary metal-oxide-semiconductor (CMOS) technology and is referred to as CMOS die. The array die and the CMOS die are suitably bonded, and electrically coupled together. In an example, the semiconductor memory device 100 is an integrated circuit (IC) package that encapsulates one or more array dies and CMOS dies.

The semiconductor memory device 100 is configured to store data in the memory array 102, and perform operations in response to received commands (CMD). In some examples, the semiconductor memory device 100 can receive write command (also referred to as program command), read command, erase command and the like, and operate accordingly. In an example, the semiconductor memory device 100 receives a write command with an address (ADDR) and data (DATA), the semiconductor memory device 100 then stores the data in the memory array 102 at the address. In another example, the semiconductor memory device 100 receives a read command with an address, the semiconductor memory device 100 then accesses the memory array 102, and outputs data stored at the address of the memory array 102. In another example, the semiconductor memory device 100 receives an erase command with an address, the semiconductor memory device 100 then resets one or more blocks of memory cells at the address to an un-programmed state (also referred to as erased state), such as "1" for NAND memory cells.

Generally, the memory array 102 can include one or more memory planes 160, and each of memory planes 160 can include a plurality of memory blocks, such as block-1 to block-N as shown in FIG. 1. In some examples, concurrent operations can take place at different memory planes 160. In some embodiments, each of the memory blocks block-1 to block-N is the smallest unit to carry out an erase operation. Each memory block includes a number of pages. In some examples, page is the smallest unit that can be programmed (i.e. written to).

In some embodiments, the memory array 102 is a flash memory array, and is implemented using 3D NAND flash memory technology. Each of the memory blocks block-1 to block-N includes a plurality of memory cell strings that are disposed vertically (e.g., perpendicular to a main surface of a die). Each memory cell string includes a plurality of transistors connected in series. The details of the memory cell string will be described with reference to FIG. 2.

In some embodiments, the peripheral circuitry 101 includes a row decoder circuit 110, a page buffer circuit 120, a data input/output (I/O) circuit 130, a voltage generator 140 and a control circuit 150 coupled together as shown in FIG. 1.

The row decoder circuit 110 can receive an address that is referred to as row address (R-ADDR), generate the word line (WL) signals and select signals, such as top select gate (TSG) signal(s), bottom select gate (BSG) signal(s), and the like based on the row address and provide the memory cell array 102 with the WL signals, and select signals. In some examples, during a write operation, the row decoder circuit 110 provides the WL signals and the select signals to the memory cell array 102 to select a page to program. During a read operation, the row decoder circuit 110 can provide the WL signals and the select signals to select a page for buffering. During an erase operation, the row decoder circuit 110 can provide suitable the WL signals and the select signals according to the present disclosure, which will be further described for example with reference to FIG. 4 and FIG. 5.

The page buffer circuit 120 is coupled to bit lines (BL) of the memory cell array 102 and configured to buffer data, such as one or more pages of data during read and write operations. In an example, during a write operation, the page buffer circuit 120 can buffer data to be programmed and drive the data to bit lines of the memory cell array 102 to write the data into the memory cell array 102. In another example, during a read operation, the page buffer circuit 120 can sense data on the bit lines of the memory cell array 102 and buffer the sensed data for outputting.

In the FIG. 1 example, the data I/O circuit 130 is coupled to the page buffer circuit 120 via data lines DL. In an example (e.g., during a write operation), the data I/O circuit 130 is configured to receive data from external circuitry of the semiconductor memory device 100, and provide the received data to the memory cell array 102 via the page buffer circuit 132. In another example (e.g., during a read operation), the data I/O circuit 130 is configured to output the data from the memory cell array 102 to external circuitry based on an address that is referred to as column address (C-ADDR).

The voltage generator 140 is configured to generate voltages of suitable levels for the proper operations of the semiconductor memory device 100. For example, during a read operation, the voltage generator 140 can generate voltages of suitable levels for source voltages, body voltage, various WL voltages, select voltages, and like that for the read operation. In some examples, the source voltages is provided as an array common source (ACS) voltages to the source terminals of the memory cell array 102 during the read operation; the body voltage is provided to, for example a P-type well (PW) that is the body portion for the memory cell strings, during the read operation. The body voltage is labeled as PW voltage in FIG. 1 as an example. The WL voltages and the select voltages are provided to the row decoder 110, thus the row decoder 110 can output the WL signals and the select signals (e.g. TSG signals and BSG signals) at the suitable voltage level during the read operation.

In another example, during an erase operation, the voltage generator 140 can generate voltages of suitable levels for source voltages, body voltage, various WL voltages, select voltages, BL voltages and like that are suitable for the erase operation. In some examples, the source voltage is provided as ACS voltages to the source terminals of the memory cell array 102 during the erase operation; the PW voltage is provided to the P-type well that is the body portion for the memory cell strings during the erase operation. The WL voltages and the select voltages are provided to the row decoder 110, thus the row decoder 110 can output the WL signals and the BSG and TSG signals at the suitable voltage level during the erase operation. The BL voltages are provided to the page buffer circuitry 120, thus the page buffer circuitry 120 can drive the bit lines (BL) at proper voltage level during the erase operation. It is noted that the BL voltage may be applied to the bit lines without going through the page buffer circuitry 120.

The control circuit 150 is configured to receive command (CMD) and address (ADDR), and provide control signals to other circuits, such as the row decoder circuit 110, the page buffer circuit 120, the data I/O circuit 130, the voltage generator 140, and the like based on the command and the address. For example, the control circuit 150 can generate the row address R-ADDR and column address C-ADDR based on the address ADDR and provide the row address R-ADDR to the row decoder 110 and the provide the column address to the data I/O circuit 130. In another example, the control circuit 150 can control the voltage generator 140 to generate voltages of suitable levels based on the received CMD. The control circuit 150 can coordinate the other circuits, to provide signals to the memory cell array 102 at the suitable time and suitable voltage levels.

In the FIG. 1 example, the control circuit 150 includes a portion 155 that is configured to generate appropriate control signals to control the other circuits to provide suitable signals to the memory cell array 102 for an erase operation that uses both body erase mechanism and GIDL erase mechanism. The signals with suitable timings and voltage levels to the memory cell array 102 can cause the usage of both the body erase mechanism and the GIDL erase mechanism for the erase operation. The waveforms of the signals will be described in details with reference FIG. 4 and FIG. 5.

Figure 2:
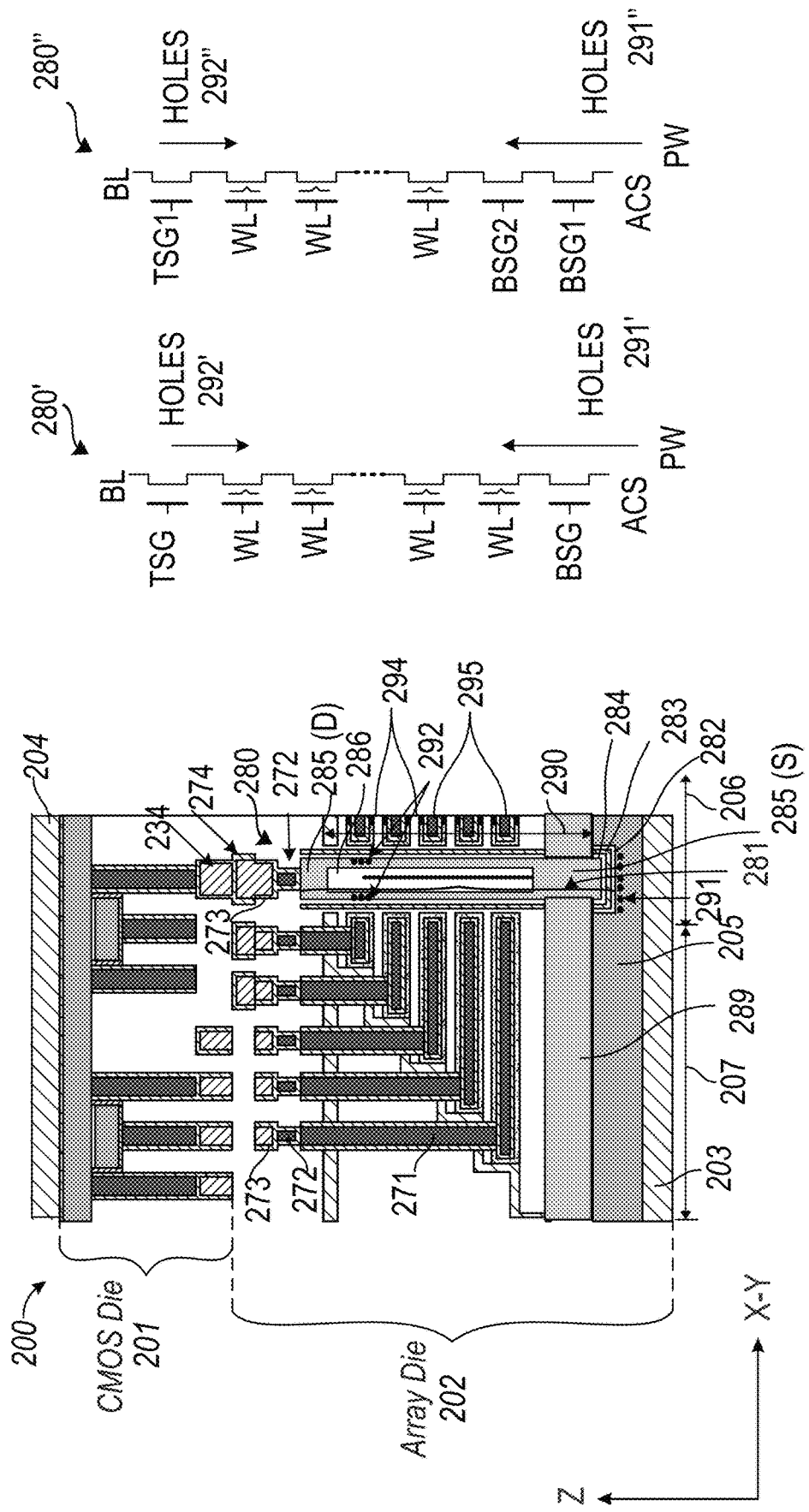
FIG. 2 shows a cross-sectional view of a semiconductor memory device and schematic symbols of memory cell strings in accordance with some embodiments.

FIG. 2 shows a cross-sectional view of a semiconductor memory device 200 according to some embodiments of the disclosure. The semiconductor memory device 200 can be the semiconductor memory device 100 in some examples. The semiconductor device 200 includes an array die 202 and a CMOS die 201 bonded together according to some embodiments of the disclosure.

It is noted that, in some embodiments, a semiconductor memory device can include multiple array dies and a CMOS die. The multiple array dies and the CMOS die can be stacked and bonded together. The CMOS die is respectively coupled to the multiple array dies, and can drive the respective array dies to operate in the similar manner as the semiconductor memory device 200.

The array die 202 includes a substrate 203, and memory cells formed on the substrate 203. The CMOS die 201 includes a substrate 204, and periphery circuitry formed on the substrate 204. For simplicity, the main surface of the substrate 203 is referred to as an X-Y plane, and the direction perpendicular to the main surface is referred to as Z direction.

The substrate 203 and the substrate 204 respectively can be any suitable substrate, such as a silicon (Si) substrate, a germanium (Ge) substrate, a silicon-germanium (SiGe) substrate, and/or a silicon-on-insulator (SOI) substrate. The substrate 203 and the substrate 204 respectively may include a semiconductor material, for example, a Group IV semiconductor, a Group III-V compound semiconductor, or a Group II-VI oxide semiconductor. The Group IV semiconductor may include Si, Ge, or SiGe. The substrate 203 and the substrate 204 respectively may be a bulk wafer or an epitaxial layer.

The semiconductor memory device 200 includes memory cell arrays (e.g., memory circuit array 102) and peripheral circuitry (e.g., the row decoder circuit 110, the page buffer circuit 120, the data I/O circuit 130, the voltage generator 140, the control circuit 150 and the like). In the FIG. 2 example, the memory cell arrays are formed on the substrate 203 of the array die 202 and the periphery circuitry is formed on the substrate 204 of the CMOS die 201. The array die 202 and the CMOS die 201 are disposed face to face (the surface with circuitry disposed on is referred to as face, and the opposite surface is referred to as back), and bonded together.

In some examples, wells can be formed in the substrate 202 respectively for blocks as body portions for the blocks. In the FIG. 2 example, a P-type well 205 is formed on the substrate 203, and a block of three dimensional (3D) NAND memory cell strings can be formed in the P-type well 205. The P-type well 205 can form a body portion (e.g., in connection with a PW terminal) for the 3D NAND memory cell strings, and a voltage that is referred to as PW can be applied to the P-type well 205 via the PW terminal. Generally, the memory cell array is formed in a core region 206 as an array of vertical memory cell strings. Besides the core region 206 and the peripheral region, the array die 202 includes a staircase region 207 (also referred to as a connection region in some examples) to facilitate making connections to, for example, gates of the memory cells in the vertical memory cell strings, gates of the select transistors, and the like. The gates of the memory cells in the vertical memory cell strings correspond to word lines for the NAND memory architecture.

In the FIG. 2 example, a vertical memory cell string 280 is shown as representation of an array of vertical memory cell strings formed in the core region 206. FIG. 2 also shows a schematic symbol version of the vertical memory cell string 280' corresponding to the vertical memory cell string 280. The vertical memory cell strings 280 are formed in a stack of layers 290. The stack of layers 290 includes gate layers 295 and insulating layers 294 that are stacked alternatingly. The gate layers 295 and the insulating layers 294 are configured to form transistors that are stacked vertically. In some examples, the stack of transistors includes memory cells and select transistors, such as one or more bottom select transistors, one or more top select transistors and the like. In some examples, the stack of transistors can include one or more dummy select transistors. The gate layers 295 correspond to gates of the transistors. The gate layers 295 are made of gate stack materials, such as high dielectric constant (high-k) gate insulator layers, metal gate (MG) electrode, and the like. The insulating layers 294 are made of insulating material(s), such as silicon nitride, silicon dioxide, and the like.

According to some aspects of the disclosure, the vertical memory cell strings are formed of channel structures 281 that extend vertically (Z direction) into the stack of layers 290. The channel structures 281 can be disposed separate from each other in the X-Y plane. In some embodiments, the channel structures 281 are disposed in the form of arrays between gate line cut structures (not shown). The gate line cut structures are used to facilitate replacement of sacrificial layers with the gate layers 295 in a gate-last process. The arrays of the channel structures 281 can have any suitable array shape, such as a matrix array shape along the X direction and the Y direction, a zig-zag array shape along the X or Y direction, a beehive (e.g., hexagonal) array shape, and the like. In some embodiments, each of the channel structures has a circular shape in the X-Y plane, and a pillar shape in the X-Z plane and Y-Z plane. In some embodiments, the quantity and arrangement of the channel structures between gate line cut structures is not limited.

In some embodiments, the channel structure 281 has a pillar shape that extends in the Z direction that is perpendicular to the direction of the main surface of the substrate 203. In an embodiment, the channel structure 281 is formed by materials in the circular shape in the X-Y plane, and extends in the Z direction. For example, the channel structure 281 includes function layers, such as a blocking insulating layer 282 (e.g., silicon oxide), a charge storage layer (e.g., silicon nitride) 283, a tunneling insulating layer 284 (e.g., silicon oxide), a semiconductor layer 285, and an insulating layer 286 that have the circular shape in the X-Y plane, and extend in the Z direction. In an example, the blocking insulating layer 282 (e.g., silicon oxide) is formed on the sidewall of a hole (into the stack of layers 280) for the channel structure 281, and then the charge storage layer (e.g., silicon nitride) 283, the tunneling insulating layer 284, the semiconductor layer 285, and the insulating layer 286 are sequentially stacked from the sidewall. The semiconductor layer 285 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ cm$^{-3}$ in some examples. The insulating layer 286 is formed of an insulating material, such as silicon oxide and/or silicon nitride, and/or may be formed as an air gap.

According to some aspects of the disclosure, the channel structure 281 and the stack of layers 290 together form the memory cell string 280. For example, the semiconductor layer 285 corresponds to the channel portions for transistors in the memory cell string 280, and the gate layers 295 corresponds to the gates of the transistors in the memory cells string 280. Generally, a transistor has a gate that controls a channel, and has a drain and a source at each side of the channel. For simplicity, in the FIG. 2 example, the upper side of the channel for transistors in FIG. 2 is referred to as the drain, and the bottom side of the channel for transistors in FIG. 2 is referred to as the source. It is noted that the drain and the source can be switched under certain driving configurations. In the FIG. 2 example, the semiconductor layer 285 corresponds to connected channels of the transistors. For a specific transistor, the drain of the specific transistor is connected with a source of an upper transistor above the specific transistor, and the source of the specific transistor is connected with a drain of lower transistor below the specific transistor. Thus, the transistors in the memory cell string 280 are connected in series.

The memory cell string 280 includes memory cell transistors (or referred to as memory cells). A memory cell transistor can have different threshold voltages based on carrier trappings in a portion of the charge storage layer 283 that corresponds to a floating gate for the memory cell transistor. For example, when a significant amount of holes are trapped (stored) in the floating gate of the memory cell transistor, the threshold voltage of the memory cell transistor is lower than a predefined value, then the memory cell transistor is in a un-programed state (also referred to as erased state) corresponding to logic "1". When holes are expelled from the floating gate, the threshold voltage of the memory cell transistor is above a predefined value, thus the memory cell transistor is in a programed state corresponding to logic "0" in some examples.

The memory cell string 280 includes one or more top select transistors configured to couple/de-couple the memory cells in the memory cell string 280 to a bit line, and includes one or more bottom select transistors configured to couple/de-couple the memory cells in the memory cell string 280 to the ACS. For example, the symbol version 280' of a memory cell string includes one top select transistor and one bottom select transistor, the symbol version 280" of a memory cell string includes one top select transistor and two bottom select transistor.

The top select transistors are controlled by top select gates (TSG). For example, when a TSG voltage (voltage applied to the TSG) is larger than a threshold voltage of the top select transistors, the top select transistors are turned on and the memory cells are coupled to the bit line; and when the TSG voltage (voltage applied to the TSG) is smaller than the threshold voltage of the top select transistors, the top select transistors are turned off and the memory cells are de-coupled to the bit line.

Similarly, the bottom select transistors are controlled by bottom select gates (BSG). For example, when a BSG voltage (voltage applied to the BSG) is larger than a threshold voltage of the bottom select transistors, the bottom select transistors are turned on and the memory cells are coupled to the ACS; and when the BSG voltage (voltage applied to the BSG) is smaller than the threshold voltage of the bottom select transistors, the bottom select transistors are turned off and the memory cells are de-coupled to the ACS.

According to some aspects of the disclosure, the bottom portion of the semiconductor layer 285 in the channel hole corresponds to a source side of the vertical memory cell string 280, and the bottom portion is labeled as 285(S). A common source layer 289 is formed in conductive connection with the source of the vertical memory cell string 280. The common source layer 289 can includes one or more layers. In some examples, the common source layer 289 includes silicon material, such as intrinsic polysilicon, doped polysilicon (such as N-type doped silicon, P-type doped silicon) and the like. In some examples, the common source layer 289 may include metal silicide to improve conductivity. The common source layer 289 is similarly in conductive connection with sources of other vertical memory cell strings (not shown), and thus forms an array common source (ACS).

In some examples, when the vertical memory cell strings 280 are configured to be erased by block, the common source layer 289 can extend and cover the core regions of a block and staircase regions for the block. In some examples, for different blocks that are erased separately, the common source layer 289 may be suitably insulated for the different blocks.

In the FIG. 2 example, in the channel structure 281, the semiconductor layer 285 extends vertically from the source side of the channel structure 281 up, and forms a top portion corresponds to a drain side of the vertical memory cell string 280. The top portion of the semiconductor layer 285 is labeled as 285(D). It is noted that drain side and the source side are named for the ease of description. The drain side and the source side may function differently from the names.

In the FIG. 2 example, a connection structure, such as a via 272 with a metal wire 273, a bonding structure 274, and the like, can be formed to electrically couple the top portion of the semiconductor layer 285(D) to a bit line (BL).

Further in FIG. 2 example, the staircase region 207 includes a staircase that is formed to facilitate word line connections to the gates of transistors (e.g., memory cells, top select transistor(s), bottom select transistor(s)). For example, a word line connection structure 270 includes a contact structure 271, a via structure 272, and metal wire 273 that are conductively coupled together. The word line connection structure 270 can electrically couple a WL to a gate terminal of a transistor in the memory cell string 280.

In the FIG. 2 example, the array die 202 and the CMOS die 201 are disposed face-to-face (circuitry side is face, and the substrate side is back) and bonded together. Generally, the periphery circuitry on the CMOS die interfaces the semiconductor device 200 with external circuitry.

In the FIG. 2 example, the CMOS die 201 and the array die 202 respectively include bonding structures that can be aligned with each other. For example the CMOS die 201 includes a bonding structure 234 and the array die 202 includes a corresponding bonding structure 274. The array die 202 and the CMOS die 201 can be suitably aligned, thus the bonding structure 234 is aligned with the bonding structure 274. When the array die 202 and the CMOS die 201 are bonded together, the bonding structure 234 is respectively bonded and electrically coupled with the bonding structure 274.

According to some aspects of the disclosure, for the memory cell string 280 in the NAND configuration, an erase operation resets memory cells. For example, during the erase operation, holes are injected and trapped in the charge storage layer 283 (or electrons are extracted from the charge storage layer 283). When holes are trapped in the charge storage layer 283 of a memory cell, the threshold voltage of the memory cell decreases, and the memory cell can enter the un-programed state (also referred to as erased state).

In a related example that uses body erase mechanism, during an erase operation, ground level voltage can be applied to the gates of the memory cells in the memory cell string 280, the source and drain of the memory cell string 280 are floating, and a relatively high voltage (e.g., about 20V) is applied to the P-type well 205. The P-type well 205 can provide holes (erase carriers) and the holes can be injected from the P-type well 205 into the semiconductor layer 285 in a bottom up direction (from the source side to the drain side of the memory cell string 280) and then injected into the charge storage layer 283 due to a negative biasing of the gate with regard to the channel voltage. In the related example, when the number of memory cells in the memory cell string 280 is large, it may be difficult to push the holes to the upper portion of the semiconductor layer 285 and may cause some memory cells that are close to drain side of the memory cell string 280 not fully erased (meaning not enough holes trapped in the upper portion of the charge storage layer 283 to lower the threshold voltage below a predefined value).

According to some aspects of the disclosure, both body erase mechanism and GIDL erase mechanism are used during an erase operation in order to effectively reset memory cells along the memory cell string 280 to the erased state even the number of memory cells in the memory cell string 280 is relatively large. For example, during an erase operation, ground level voltage can be applied to the gates of the memory cells in the memory cell string 280, the source of the memory cell string 280 is floating and a relatively high voltage (e.g., about 20V) is applied to the P-type well 205. The P-type well 205 can provide erase carriers (e.g., holes shown by 291) and the holes can be driven from the P-type well 205 into the semiconductor layer 285 in a bottom up direction (as shown by 291' and 291") and then injected into the charge storage layer 283 when the gates of the memory cells are negatively biased with regard to the channel.

In addition, GIDL erase mechanism is induced at the drain side of the memory cell string 280. In some embodiments, a negative biasing is applied to the gate(s) of the top select transsistor(s) (next to the drain of the memory cell string 280) with respect to the drain of the of the memory cell string 280. Due to the negative biasing, a P-type region is generated and a P-N junction is formed at the drain side of the semiconductor layer 285. Further, high field is applied on the P-N junction, and then causes gate-induced drain leakage (GIDL) due to band-to-band tunneling, and hole current is generated and flows down from the drain as shown by 292. The holes can be injected into the upper portion of the charge storage layer 283 when the gates of the memory cells are negatively biased with regard to the channel.

It is noted that, when both body erase mechanism and GIDL erase mechanism are used, holes can be generated and driven from both the source side and drain side of the memory cell string 280, thus memory cells along the memory cell string 280 can be erased relative easily.

Figure 3:
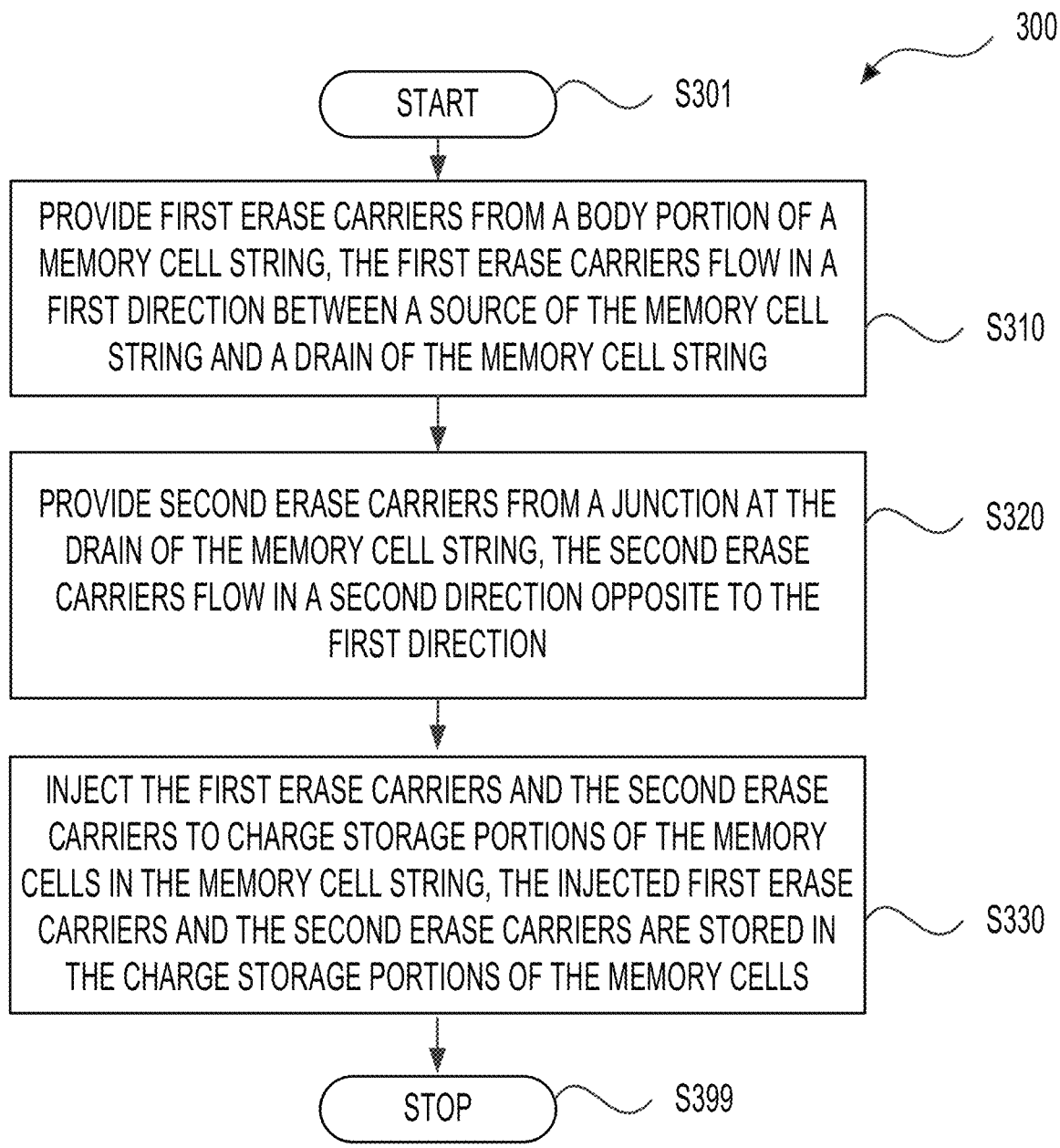
FIG. 3 shows a flow chart outlining a process example in accordance with some embodiments.

FIG. 3 shows a flow chart outlining a process 300 according to some embodiments of the disclosure. In some examples, the process 300 is executed in a semiconductor memory device, such as the semiconductor memory device 100, the semiconductor memory device 200, and the like during an erase operation. The semiconductor memory device includes an array of memory cell strings. A memory string includes transistors, such as top select transistor(s) memory cell transistors, bottom select transistor(s), and the like that are connected in series. The process starts at S301 and proceeds to S310. During the erase operation, memory cells in a memory cell string are reset to the un-programed state, such as a low threshold voltage state corresponding to logic "1" in the example of NAND memory.

At S310, first erase carriers are provided from a body portion of the memory cell string during an erase operation for resetting memory cells in a memory cell string. The first erase carriers flow in a first direction from a source side of the memory cell string to a drain side of the memory cell string. The first erase carriers are generated and provided according to body erase mechanism. Specifically, in an example, a relatively large voltage is applied to a body terminal, such as P-type well in the FIG. 2 example, and the ACS is floated. Thus, holes in the P-type well can be driven into the semiconductor layer 285 in a direction from the source side to the drain side of the memory cell string.

At S320, second erase carriers are provided from a junction at the drain side of the memory cell string. The second erase carriers flow in a second direction from the drain side of the memory cell string to the source side of the memory cell string. The second erase carriers are generated and provided according to GIDL erase mechanism. Specifically, in an example, one or more top select gates of the top select transistor(s) can be negatively biased with regard the drain(s) of the top select transistors. Due to the negative biasing, P-type regions can be generated and P-N junctions can be formed at the drain side of the semiconductor layer 285. Further, high field can be applied on the P-N junctions. The high field can cause gate-induced drain leakage (GIDL) due to band-to-band tunneling, and hole current is generated and flows down from the drain side to the source side as shown in FIG. 2 example.

At S330, the first erase carriers and the second erase carriers are injected to charge storage portions of the memory cells in the memory cell string. For example, the gates of the memory cells are negatively biased with regard to the channel (e.g., the semiconductor layer 285), thus holes in the channel, such as the first erase carriers and the second erase carriers, can be injected into the charge storage layer 283. The injected holes are trapped in the charge storage portions of the memory cells. When enough holes are trapped, the threshold voltages of the memory cells are lower that certain predefined value, and the memory cells enter the un-programed state. Then, the process proceeds and terminates in an example.

Figure 4:
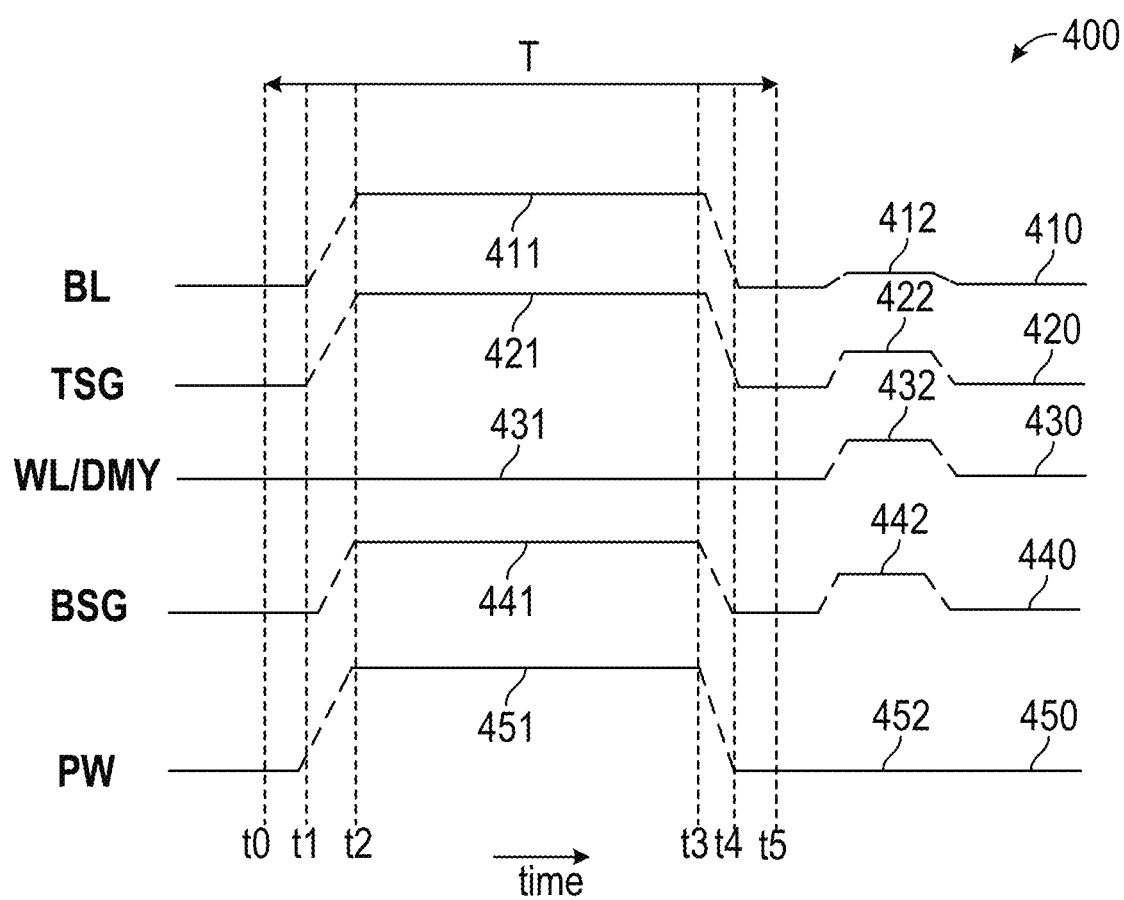
FIG. 4 shows a diagram of waveforms for signals in a semiconductor memory device in accordance with some embodiments.

FIG. 4 shows a diagram 400 of waveforms for signals provided to a memory cell string, such as a memory cell string represented by the symbol 280', in accordance with some embodiments. The diagram 400 includes a first waveform 410 for BL signals, a second waveform 420 for a TSG signal, a third waveform 430 for WL signals (or dummy WL signals), a fourth waveform 440 for a BSG signal, and a fifth waveform 450 for a PW signal. In some embodiments, the control circuit for mixed erase 155 can control the periphery circuitry 101 to generate the BL signals having the first waveform 410, generate the TSG signal having the second waveform 420, generate the WL signals having the third waveform 430, generate the BSG signal having the fourth waveform 440 and generate the PW signal having the fifth waveform 450. One of the BL signals, the TSG signal, the WL signals, the BSG signal, and the PW signal can be provided to for example a memory cell string represented by the symbol 280'.

In the FIG. 4 example, an erase operation is performed during a time duration T.

At time t0, in an example, the periphery circuitry 101 receives a command to erase a block at an address. For example, a memory cell string represented by the symbol 280' is disposed in the block. The control circuit for the mixed erase 155 then provides control signals to the other components of the periphery circuitry 101 to generate the PW signal, the ACS signal, the WL signals, the TSG signal, the BSG signal and BL signals. It is noted that, in the FIG. 4 example, at time t0, the PW signal, the WL signals, the TSG signal, the BSG signal and BL signals are at ground level or floated in an example. It is noted that the ACS signal may be a floating signal that is not connected to any absolute voltage level during the time during T for the erase operation, and is not shown in FIG. 4.

At time t1, the periphery circuitry 101 outputs the PW signal, the WL signals, the TSG signal, the BSG signal and BL signals. In the FIG. 4 example, at time t1, the voltage levels of the PW signal, the TSG signal, the BSG signal and BL signals start to rise. The periphery circuitry 101 outputs the WL signals at ground level in an example. The PW signal is provided to drive, for example the P-type well 205. The common source layer 289 may have a floating voltage level. The gate layers 295 are driven according to the TSG signal, the WL signals, and the BSG signal. The bonding structures 234 and 274 are driven according to the BL signal.

At t2, the BL signal rises to an erase voltage level, such as about 20V in an example, and keeps the erase voltage level as shown by 411. The TSG signal rises to a first select gate voltage that is lower than the erase voltage level, such as in a range of 10V to 14V in an example, and keeps the first select gate voltage as shown by 421. The WL signals are maintained at the ground level in an example. In some examples, the WL signals can be raised and maintained at a level in a range of 0V to 3V. The BSG signal rises to a relatively high voltage level, such as in a range of 10V to 20V in an example, and keeps the voltage level as shown by 441. The PW signal rises to an erase voltage level, such as about 20V in an example, and keeps the erase voltage level as shown by 451.

According to an aspect of the disclosure, the PW signal, the BSG signal, the floating ACS signal and the WL signals applied on the memory cell string can induce the body erase mechanism in the memory cell string. For example, holes in the P-type well 205 are driven into the semiconductor layer 285 corresponding to the channel portion of the memory cell string. The relatively high voltage of the BSG signal allows the holes to flow into the channel portion of the memory cells, for example in a direction bottom up. Further, the negative biasing of the WL with regard to the channel portion can inject the holes into the charge storage layer 283, for example bottom portion of the charge storage layer 283.

According to another aspect of the disclosure, the BL signal, the TSG signal, and the WL signals applied on the memory cell string can induce the GIDL erase mechanism. For example, the gate of the top select transistor is negatively biased due to the voltage difference of the TSG signal and the BL signal. Due to the negative biasing, P-type region can be generated and P-N junctions can be formed at the drain of the top select transistor. Further, due to the voltage difference of the TSG signal and the BL signal, a high field is applied on the P-N junctions. The high field can cause gate-induced drain leakage (GIDL) due to band-to-band tunneling, and hole current is generated and flows down from the drain side to the source side in the semiconductor layer 285. Further, the negative biasing of the WL with regard to the channel portion can inject the holes into the charge storage layer 283, for example upper portion of the charge storage layer 283.

At t3, the BL signal, the TSG signal, the BSG signal, the PW signal start to decreases.

At t4, the BL signal, the TSG signal, the BSG signal, the PW signal returns to the ground level in an example.

At t5, the erase cycle is ended.

It is noted that, in some examples, after the erase operation, a verification operation can be conducted. The verification operation can verify whether the memory cells in the memory cell string are reset to the un-programed state. For example, the control circuit 155 then provides control signals to the other components of the periphery circuitry 101 to generate the PW signal, the ACS signal, the WL signals, the TSG signal, and the BSG signal and then detect the BL signal. For example, to verify the un-programed state of the memory cells, the PW signal is set at a ground level as shown by 452; the BSG signal is set to a turn on level for the bottom select transistor, such as about 3V-5V, as shown by 442; the TSG signal is set to a turn on level for the top select transistor, such as about 3V-5V, as shown by 422; and the WL signals are set to a level between a first threshold voltage (e.g., for the un-programed state) and a second threshold voltage (e.g., for the programed state), such as about 3V-5V in an example, as shown by 432. The voltage level of the bit line (shown by 412) can be sensed and amplified. When the voltage level corresponds to logic "0", the memory cells are in the un-programed state, and the erase operation is verified to be successful. When the voltage level corresponds to logic "1", the erase operation is not successfully performed, and another erase operation may be performed in an example.

It is noted that, in some example, the memory cell string includes dummy memory cells (DMY) that can be controlled similarly as the WL signals to the memory cells.

Figure 5:
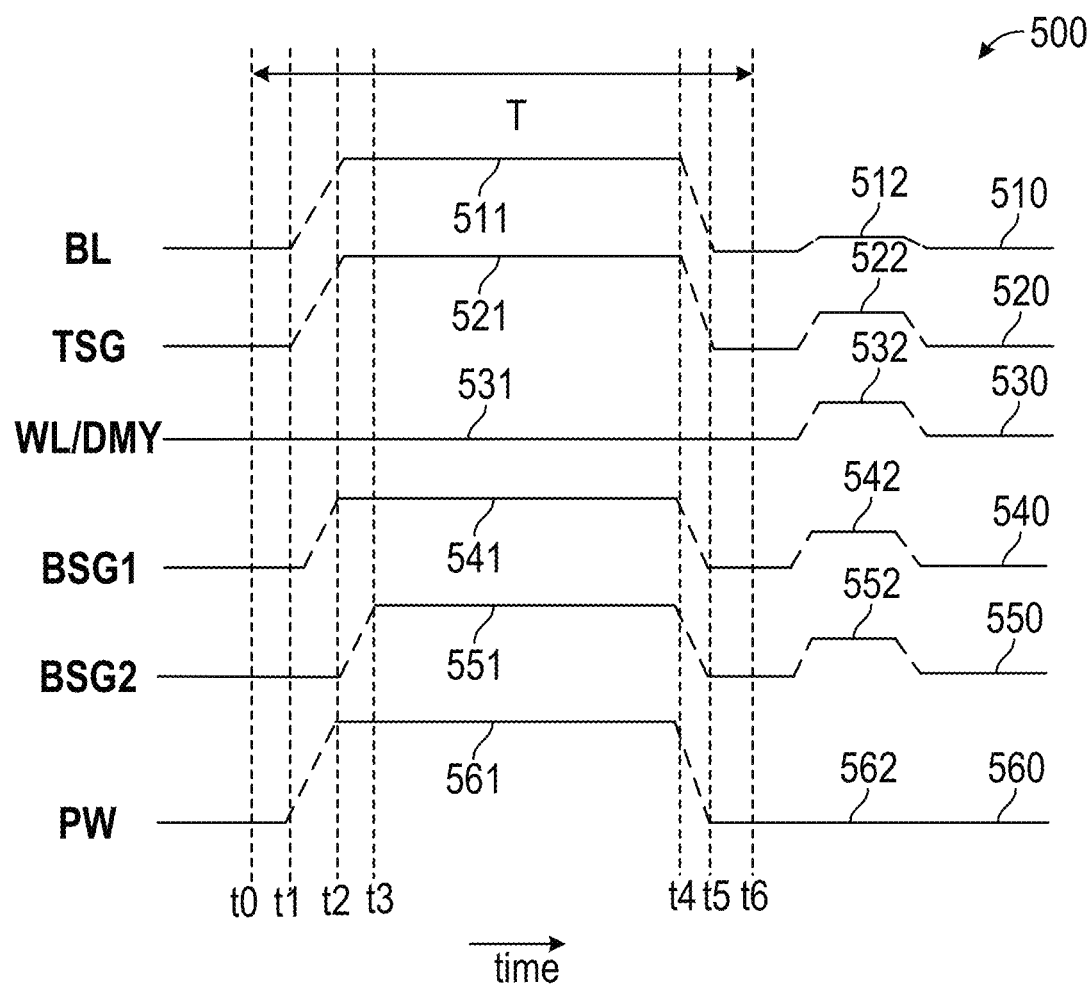
FIG. 5 shows a diagram of waveforms for signals in a semiconductor memory device in accordance with some embodiments.

FIG. 5 shows a diagram 500 of waveforms for signals provided to a memory cell string, such as a memory cell string represented by the symbol 280", in accordance with some embodiments. The diagram 500 includes a first waveform 510 for BL signals, a second waveform 520 for a TSG signal, a third waveform 530 for WL signals (or dummy WL signals), a fourth waveform 540 for a BSG1 signal, a fifth waveform 550 for a BSG2 signal, and a sixth waveform 560 for a PW signal. In some embodiments, the control circuit for mixed erase 155 can control the periphery circuitry 101 to generate the BL signals having the first waveform 510, generate the TSG signal having the second waveform 520, generate the WL signals having the third waveform 530, generate the BSG1 signal having the fourth waveform 540, generate the BSG2 signal having the fifth waveform 550, and generate the PW signal having the sixth waveform 560. One of the BL signals, the TSG signal, the WL signals, the BSG1 signal, the BSG2 signal and the PW signal can be provided to for example a memory cell string represented by the symbol 280".

In the FIG. 5 example, an erase operation is performed during a time duration T.

At time t0, in an example, the periphery circuitry 101 receives a command to erase a block at an address. For example, a memory cell string represented by the symbol 280" is disposed in the block. The control circuit for the mixed erase 155 then provides control signals to the other components of the periphery circuitry 101 to generate the PW signal, the ACS signal, the WL signals, the TSG signal, the BSG1 signal, the BSG2 signal and BL signals. It is noted that, in the FIG. 5 example, at time t0, the PW signal, the WL signals, the TSG signal, the BSG1 signal, the BSG2 signal and BL signals are at ground level or floated in an example. It is noted that the ACS signal may be a floating signal that is not connected to any absolute voltage level during the time during T for the erase operation, and is not shown in FIG. 5.

At time t1, the periphery circuitry 101 outputs the PW signal, the WL signals, the TSG signal, the BSG1 signal, the BSG2 signal and BL signals. In the FIG. 5 example, at time t1, the voltage levels of the PW signal, the TSG signal, the BSG1 signal, and BL signals start to rise. The periphery circuitry 101 outputs the WL signals at ground level in an example. The PW signal is provided to drive, for example the P-type well 205. The common source layer 289 may have a floating voltage level. The gate layers 295 are driven according to the TSG signal, the WL signals, and the BSG1 signal and the BSG2 signal. The bonding structures 234 and 274 are driven according to the BL signal.

At t2, the BL signal rises to an erase voltage level, such as about 20V in an example, and keeps the erase voltage level as shown by 511. The TSG signal rises to a first select gate voltage that is lower than the erase voltage level, such as in a range of 10V to 14V in an example, and keeps the first select gate voltage as shown by 521. The WL signals are maintained at the ground level in an example. In some examples, the WL signals can be raised and maintained at a level in a range of 0V to 3V. The BSG1 signal rises to a first high voltage level, such as in a range of 10V to 20V in an example, and keeps the voltage level as shown by 541. The PW signal rises to an erase voltage level, such as about 20V in an example, and keeps the erase voltage level as shown by 561. In some examples, the BSG2 signal starts to rise at t2.

According to an aspect of the disclosure, the PW signal, the BSG1 signal, the floating ACS signal and the WL signals applied on the memory cell string can induce the body erase mechanism in the memory cell string. For example, holes in the P-type well 205 are driven into the semiconductor layer 285 corresponding to the channel portion of the memory cell string. The relatively high voltage of the BSG1 signal allows the holes to flow into the channel portion of the memory cells, for example in a direction bottom up. Further, the negative biasing of the WL with regard to the channel portion can inject the holes into the charge storage layer 283, for example bottom portion of the charge storage layer 283.

According to another aspect of the disclosure, the BL signal, the TSG signal, and the WL signals applied on the memory cell string can induce the GIDL erase mechanism. For example, the gate of the top select transistor is negatively biased due to the voltage difference of the TSG signal and the BL signal. Due to the negative biasing, P-type region can be generated and P-N junctions can be formed at the drain of the top select transistor. Further, due to the voltage difference of the TSG signal and the BL signal, a high field is applied on the P-N junctions. The high field can cause gate-induced drain leakage (GIDL) due to band-to-band tunneling, and hole current is generated and flows down from the drain side to the source side in the semiconductor layer 285. Further, the negative biasing of the WL with regard to the channel portion can inject the holes into the charge storage layer 283, for example upper portion of the charge storage layer 283.

At t3, the BSG2 signal rises to a second high voltage level, such as in a range of 8V to 10V in an example, and keeps the voltage level as shown by 551. According to an aspect of the disclosure, the BSG1 signal, the BSG2 signal and the WL signals applied on the memory cell string can induce the GIDL erase mechanism. For ease of description, the bottom select transistor that is disposed closet to the source side of the memory cell string is referred to as the first bottom select transistor, and the bottom select transistor above the first bottom select transistor is referred to as the second bottom select transistor. The gate of the second select transistor is negatively biased due to the voltage difference of the BSG2 signal with regard to the BSG1 signal. Due to the negative biasing, P-type region can be generated at the source of the second bottom select transistor and P-N junctions can be formed at the source of the second bottom select transistor. Further, due to the voltage difference of the BSG2 signal and the BSG1 signal, a high field is applied on the P-N junctions. The high field can cause gate-induced drain leakage (GIDL) due to band-to-band tunneling, and hole current is generated and flows up from the source side to the drain side in the semiconductor layer 285. Further, the negative biasing of the WL with regard to the channel portion can inject the holes into the charge storage layer 283, for example upper portion of the charge storage layer 283.

It is noted that the second bottom select transistor is disposed closer to the memory cells in the memory cell string than the first bottom select transistor, and the P-type well, and it may be easier to drive the hole current from the source of the second bottom select transistor to the channel portion for the memory cells.

At t4, the BL signal, the TSG signal, the BSG1 signal, the BSG2 signal, the PW signal start to decreases.

At t5, the BL signal, the TSG signal, the BSG1 signal, the BSG2 signal, the PW signal returns to the ground level in an example.

At t6, the erase cycle is ended.

It is noted that, in some examples, after the erase operation, a verification operation can be conducted. The verification operation can verify whether the memory cells in the memory cell string are reset to the un-programmed state. For example, the control circuit 155 then provides control signals to the other components of the periphery circuitry 101 to generate the PW signal, the ACS signal, the WL signals, the TSG signal, the BSG1 signal, and the BSG2 signal, then detect the BL signal. For example, to verify the un-programed state of the memory cells, the PW signal is set at a ground level as shown by 562; the BSG1 signal is set to a turn on level for the first bottom select transistor, such as about 3V-5V, as shown by 542; the BSG2 signal is set to a turn on level for the second bottom select transistor, such as about 3V-5V, as shown by 552; the TSG signal is set to a turn on level for the top select transistor, such as about 3V-5V, as shown by 522; and the WL signals are set to a level between a first threshold voltage (e.g., for the un-programed state) and a second threshold voltage (e.g., for the programed state), such as about 3V-5V in an example, as shown by 532. The voltage level of the bit line (shown by 512) can be sensed and amplified. When the voltage level corresponds to logic "0", the memory cells are in the un-programed state, and the erase operation is verified to be successful. When the voltage level corresponds to logic "1", the erase operation is not successfully performed, and another erase operation may be performed in an example.

It is noted that, in some examples, the memory cell string includes dummy memory cells (DMY) that can be controlled similarly as the WL signals to the memory cells.

It is also noted that, in some examples, the memory cell string includes multiple top select transistors. In some embodiments, the TSG signals to control the top select transistors can be configured similarly to the BSG1 signal and the BSG2 signal, thus the GIDL can be induced at a top select transistor that is the closet one to the memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for data erase in a memory device, comprising:
providing first erase carriers from a body portion for the memory cell string using a body erase mechanism, during an erase operation for resetting memory cells connected in series in a memory cell string, the first erase carriers flowing in a first direction between a source side of the memory cell string and a drain side of the memory cell string;
providing second erase carriers from a junction at the drain side of the memory cell string using a gate-induced drain leakage (GIDL) erase mechanism, during the erase operation, the second erase carriers flowing in a second direction that is opposite of the first direction; and
injecting, during the erase operation, the first erase carriers and the second erase carriers to charge storage portions of the memory cells in the memory cell string, the injected first erase carriers and the second erase carriers being stored in the charge storage portions of the memory cells.

2. The method of claim 1, wherein the first erase carriers and the second erase carriers are holes.

3. The method of claim 2, wherein providing the first erase carriers comprises:
floating a source terminal at the source side of the memory cell string; and
applying a positive voltage to a P-type well corresponding to the body portion of the memory cell string, the positive voltage causing the first erase carriers to flow in the first direction.

4. The method of claim 3, wherein providing the second erase carriers comprises:
negatively biasing a gate terminal of a first select transistor in the memory cell string with regard to a drain terminal of the first select transistor, the negative biasing causing a generation of the second erase carriers at a P-N junction at the drain side of the memory cell string due to a band-to-band tunneling at the P-N junction.

5. The method of claim 4, wherein the first select transistor is a closet select transistor to the drain side of the memory cell string, and the method further comprises:
negatively biasing a gate terminal of a second select transistor in the memory cell string with regard to a drain terminal of the second select transistor that is disposed next to the first select transistor.

6. The method of claim 5, further comprising:
applying an erase voltage to a drain terminal at the drain side of the memory cell string;
applying a first voltage that is lower than the erase voltage on the gate terminal of the first select transistor; and
applying a second voltage that is lower than the first voltage on the gate terminal of the second select transistor.

7. The method of claim 3, further comprising:
negatively biasing a gate terminal of a first select transistor at the source side of the memory cell string with regard to a source/drain terminal of the first select transistor, the negative biasing causing a generation of additional erase carriers at a P-N junction at the source side of the memory cell string due to a band-to-band tunneling at the P-N junction.

8. The method of claim 7, wherein the first select transistor is a closet select transistor to the source side of the memory cell string, and the method further comprises:

negatively biasing a gate terminal of a second select transistor in the memory cell string with regard to a drain terminal of the second select transistor that is disposed next to the first select transistor.

9. The method of claim 8, further comprising:
applying a first voltage that is lower than the positive voltage applied to the P-type well of the memory cell string; and
applying a second voltage that is lower than the first voltage on the gate terminal of the second select transistor.

10. The method of claim 1, wherein the first erase carriers and the second erase carriers are provided in a same erase cycle.

11. A semiconductor memory device, comprising:
a memory cell array including at least a memory cell string with memory cells connected in series in the memory cell string; and
peripheral circuitry comprising a control circuit, the control circuit being configured to cause the periphery circuitry to:
provide first erase carriers from a body portion for the memory cell string using a body erase mechanism, during an erase operation for resetting memory cells connected in series in a memory cell string, the first erase carriers flowing in a first direction between a source side of the memory cell string and a drain side of the memory cell string;
provide second erase carriers from a junction at the drain side of the memory cell string using a gate-induced drain leakage (GIDL) erase mechanism, during the erase operation, the second erase carriers flowing in a second direction that is opposite of the first direction; and
inject, during the erase operation, the first erase carriers and the second erase carriers to charge storage portions of the memory cells in the memory cell string, the injected first erase carriers and the second erase carriers being stored in the charge storage portions of the memory cells.

12. The semiconductor memory device of claim 11, wherein the first erase carriers and the second erase carriers are holes.

13. The semiconductor memory device of claim 12, wherein the control circuitry is configured to cause the periphery circuitry to:
float a source terminal at the source side of the memory cell string; and
apply a positive voltage to a P-type well corresponding to the body portion of the memory cell string, the positive voltage causing the first erase carriers to flow in the first direction.

14. The semiconductor memory device of claim 13, wherein the control circuitry is configured to cause the periphery circuitry to:

negatively bias a gate terminal of a first select transistor in the memory cell string with regard to a drain terminal of the first select transistor, the negative biasing causing a generation of the second erase carriers at a P-N junction at the drain side of the memory cell string due to a band-to-band tunneling at the P-N junction.

15. The semiconductor memory device of claim 14, wherein the first select transistor is a closet select transistor to the drain side of the memory cell string, and the control circuit is configured to cause the periphery circuitry to:
negatively bias a gate terminal of a second select transistor in the memory cell string with regard to a drain terminal of the second select transistor that is disposed next to the first select transistor.

16. The semiconductor memory device of claim 15, the control circuitry is configured to cause the periphery circuitry to:
apply an erase voltage to a drain terminal at the drain side of the memory cell string;
apply a first voltage that is lower than the erase voltage on the gate terminal of the first select transistor; and
apply a second voltage that is lower than the first voltage on the gate terminal of the second select transistor.

17. The semiconductor memory device of claim 13, the control circuitry is configured to cause the periphery circuitry to:
negatively bias a gate terminal of a first select transistor at the source side of the memory cell string with regard to a source/drain terminal of the first select transistor, the negative biasing causing a generation of additional erase carriers at a P-N junction at the source side of the memory cell string due to a band-to-band tunneling at the P-N junction.

18. The semiconductor memory device of claim 17, wherein the first select transistor is a closet select transistor to the source side of the memory cell string, the control circuitry is configured to cause the periphery circuitry to:
negatively bias a gate terminal of a second select transistor in the memory cell string with regard to a drain terminal of the second select transistor that is disposed next to the first select transistor.

19. The semiconductor memory device of claim 18, wherein the control circuitry is configured to cause the periphery circuitry to:
apply a first voltage that is lower than the positive voltage applied to the P-type well of the memory cell string; and
apply a second voltage that is lower than the first voltage on the gate terminal of the second select transistor.

20. The semiconductor memory device of claim 11, wherein the control circuit is configured to cause the periphery circuitry to provide the first erase carriers and the second erase carriers for the erase operation in a same erase cycle.

* * * * *